United States Patent [19]

Tsutsumi et al.

[11] Patent Number: 5,382,807
[45] Date of Patent: Jan. 17, 1995

[54] FIELD EFFECT THIN FILM TRANSISTOR AND STATIC-TYPE SEMICONDUCTOR MEMORY DEVICE PROVIDED WITH MEMORY CELL HAVING COMPLEMENTARY FIELD EFFECT TRANSISTOR AND METHOD OF MANUFACTURING THE SAME

[75] Inventors: Kazuhito Tsutsumi; Motoi Ashida; Yasuo Inoue, all of Hyogo, Japan

[73] Assignee: Mitsubishi Denki Kabushiki Kaisha, Tokyo, Japan

[21] Appl. No.: 192,761

[22] Filed: Feb. 7, 1994

Related U.S. Application Data

[63] Continuation of Ser. No. 878,830, May 5, 1992, abandoned.

[30] Foreign Application Priority Data

May 9, 1991 [JP] Japan .................... 3-104516

[51] Int. Cl.⁶ ............................................. H01L 29/78
[52] U.S. Cl. ........................................ 257/69; 257/903; 257/66; 257/336; 257/369; 257/351; 257/338; 365/181
[58] Field of Search .................. 257/903, 369, 67, 69, 257/70, 336, 344, 408, 338, 66, 351; 365/181, 182, 188

[56] References Cited

U.S. PATENT DOCUMENTS

| | | | |
|---|---|---|---|
| 4,555,721 | 11/1985 | Bansal et al. | 257/369 |
| 5,057,898 | 10/1991 | Adan et al. | 257/369 |
| 5,134,581 | 7/1992 | Ishibashi et al. | 365/181 |
| 5,194,749 | 3/1993 | Meguro et al. | 257/903 |
| 5,208,476 | 5/1993 | Inoue | 257/66 |
| 5,214,295 | 5/1993 | Manning | 257/67 |

FOREIGN PATENT DOCUMENTS

| | | | |
|---|---|---|---|
| 0312955A3 | 4/1989 | European Pat. Off. | |
| 0457434A1 | 11/1991 | European Pat. Off. | |
| 63-260162 | 10/1988 | Japan | 257/67 |
| 1202858 | 8/1989 | Japan | 257/903 |
| 415951 | 1/1992 | Japan | 257/903 |

OTHER PUBLICATIONS

"Effects of Lightly Doped Drain Structure with Optimum Ion Dose on p-Channel MOSFET's", IEEE Trans. on Electron Devices, by T. Kaga and Y. Sakai, vol. 35 No. 12, 1988, pp. 2384–2389.

"A 25 μm₂ New Poly-Si PMOS Load (PPL) SRAM Cell Having Excellent Soft Error Immunity", IEDM, 1988, by T. Yamahaka, et al, pp. 48–51.

*Primary Examiner*—Jerome Jackson
*Assistant Examiner*—John F. Guay
*Attorney, Agent, or Firm*—Lowe, Price, LeBlanc & Becker

[57] ABSTRACT

A structure of a thin film transistor capable of reducing the power consumption in the waiting state and stabilizing the data holding characteristic in application of the thin film transistor as a load transistor in a memory cell in a CMOS-type SRAM is provided. A gate electrode is formed of a polycrystalline silicon film on a substrate having an insulating property. A gate insulating film is formed on the gate electrode. A polycrystalline silicon film is formed on the gate electrode with the gate insulating film interposed therebetween. Source/drain regions including a region of low concentration and a region of high concentration are formed in one and another regions of the polycrystalline silicon film separated by the gate electrode. Thus, the thin film transistor is formed. The thin film transistor is applied to p-channel MOS transistors serving as load transistors in a memory cell of a CMOS-type SRAM. P-channel MOS transistors are connected to n-channel MOS transistors serving as driver transistors in the memory cell. The n-channel MOS transistors are formed in a p-type well region, and the p-channel MOS transistors are formed on an interlayer insulating film on the n-channel MOS transistors.

17 Claims, 14 Drawing Sheets

FIELD EFFECT THIN FILM TRANSISTOR AND STATIC-TYPE SEMICONDUCTOR MEMORY DEVICE PROVIDED WITH MEMORY CELL HAVING COMPLEMENTARY FIELD EFFECT TRANSISTOR AND METHOD OF MANUFACTURING THE SAME

This application is a continuation of application Ser. No. 07/878,830 filed May 5, 1992.

BACKGROUND OF THE INVENTION

1. Field of the Invention

The present invention generally relates to a static-type semiconductor memory device and a field effect transistor and methods of manufacturing the same, and, more particularly, to a thin film transistor (TFT), a method of manufacturing a TFT, a static-type semiconductor memory device provided with a memory cell having a complementary field effect transistor and a method of manufacturing the same. The present invention is particularly useful in conjunction with a CMOS-type SRAM (Static Random Access Memory) to which a TFT is applied.

2. Description of the Background Art

What is called a SRAM is already well known as a static-type semiconductor memory device. Since the present invention has the most preferable effects when it is applied to a SRAM, a SRAM will be described in the following.

FIG. 16A is an equivalent circuit diagram illustrating one memory cell in a conventional CMOS-type SRAM. FIG. 16B is a plan view schematically illustrating an arrangement in the memory cell in the SRAM illustrated in FIG. 16A. FIG. 16C is a cross sectional view schematically illustrating a cross sectional structure of the memory cell in the SRAM illustrated in FIG. 16A.

Referring to FIGS. 16A–16C, a flip-flop type memory cell is implemented, including two driver transistors (n-channel MOS transistors) Q3, Q4 having the gate electrodes and drain electrodes cross-coupled and two load transistors (p-channel MOS transistors) Q5, Q6 connected, respectively, to the drain electrodes of driver transistors. Two access transistors (n-channel MOS transistors) Q1, Q2 are connected, respectively, to the drain electrodes of the two driver transistors Q3, Q4. The gate electrodes of access transistors Q1, Q2 are connected to a word line WL. When the word line WL is selected, data held in driver transistors Q3, Q4 are transferred through access transistors Q1, Q2 to bit lines BLa, BLb. One memory cell node N1 is connected to the drain electrode of driver transistor Q3, to the gate electrode of driver transistor Q4, to the drain electrode of load transistor Q5, and to the gate electrode of load transistor Q6. The other memory cell node N2 is connected to the gate electrode of driver transistor Q3, to the drain electrode of driver transistor Q4, to the gate electrode of load transistor Q5, and to the drain electrode of load transistor Q6. Source electrodes of driver transistors Q3, Q4 are connected to a ground potential GND. Source electrodes of load transistors Q5 Q6 are connected to a supply potential Vcc.

The drain electrodes and the gate electrodes of driver transistors Q3, Q4 are mutually cross-connected to form a flipflop circuit having two stable states. This enables storing of bit data. Specifically, data of one bit can be stored by holding a state in which the potential of one memory cell node N1 is at "High" level, and the potential of the other memory cell node N2 is at "Low" level, or a state which is reverse to that state. When a desired memory cell is selected, i.e. when the word line WL is at "High" level, access transistors Q1, Q2 are brought to ON state. This causes memory cell nodes N1, N2 to be conduct to bit lines Bla, Blb. At this time, voltages corresponding to the states of respective driver transistors Q3, Q4 come to appear on bit lines BLa, BLb through access transistors Q1, Q2. Thus, data held in the memory cell is read. When data is written into the memory cell, voltages corresponding to desired states to be written are applied to respective bit lines BLa, BLb with access transistors Q1, Q2 in ON state. In order to maintain the state of storing data latched by the flip-flop circuit implemented with driver transistors Q3, Q4, current is supplied from supply potential Vcc through load transistors Q5, Q6.

As described above, a memory cell in a CMOS-type SRAM is implemented with six transistors Q1–Q6. Therefore, as illustrated in FIG. 16B, a region where four n-channel MOS transistors are formed and a region where two p-channel MOS transistors are formed are necessary for constituting a memory cell. In addition, as illustrated in FIG. 16C, a p-type well region (p-Well) and an n-type well region (n-Well) are necessary for forming the n-channel MOS transistors and the p-channel MOS transistors in a semiconductor substrate. Therefore, a large flat area is necessary for forming a memory cell in a CMOS-type SRAM as long as a bulk-type MOS transistor (a MOS transistor formed on the surface of a semiconductor substrate) is used. Accordingly, a memory cell in a CMOS-type SRAM implemented with a bulk MOS transistor is disadvantageous for achieving high density.

High resistance load type memory cell has one structure of a memory cell in SRAM for solving the above problem and enabling high densification. FIG. 17A is an equivalent circuit diagram illustrating a structure of a memory cell in a SRAM of a high resistance load type. FIG. 17B is a plan view schematically illustrating an arrangement in the memory cell illustrated in FIG. 17 A. FIG. 17C is a cross sectional view schematically illustrating a cross sectional structure of the memory cell illustrated in FIG. 17A.

Referring to FIGS. 17A–17C, a flip-flop type memory cell is implemented, including two driver transistors (n-channel MOS transistors) Q3, Q4 having the gate electrodes and drain electrodes respectively cross-coupled and two high resistance loads HR1, HR2 connected, respectively, to the drain electrodes of the driver transistors. Two access transistors (n-channel MOS transistors) Q1, Q2 are connected to the drain electrodes of two driver transistors Q3, Q4, respectively. The gate electrodes of access transistors Q1, Q2 are connected to a word line WL. When the word line WL is selected, data held in driver transistors Q3, Q4 are transferred through access transistors Q1, Q2 to bit lines BLa, BLb. One memory cell node N1 is connected to the drain electrode of driver transistor Q3 and to the gate electrode of driver transistor Q4. The other memory cell node N2 is connected to the gate electrode of drive transistor Q3 and to the drain electrode of driver transistor Q4. Source electrodes of driver transistors Q3, Q4 are connected to a ground potential GND. The drain electrodes of driver transistors Q3, Q4 are connected through high resistance loads HR1, HR2 to a supply potential Vcc.

In the high resistance load-type memory cell implemented as described above, driver transistors Q3, Q4 have the drain electrodes and gate electrodes mutually cross-connected to form a flip-flop circuit having two stable states as in a CMOS-type memory cell. This enables storing of bit data. The data reading operation and data writing operation are the same as in the above-described memory cell of CMOS type. This memory cell differs from the memory cell of CMOS type in that current is supplied from supply potential Vcc through high resistance loads HR1, HR2 for maintaining the state of storing data latched by the flip-flop circuit implemented with driver transistors Q3, Q4.

As described above, a high resistance load type memory cell is implemented with four transistors Q1–Q4 and two high resistance loads HR1, HR2. As illustrated in FIG. 17B, in order to form a high resistance load type memory cell, first, a region where four n-channel MOS transistors are to be formed is secured. A high resistance load HR is formed on two n-channel MOS transistors constituting driver transistors Q3, Q4. As illustrated in FIG. 17C, only a p-type well region (p-Well) is necessary for implementing a high resistance load type memory cell. Therefore, the flat area necessary for a memory cell is smaller as compared to a memory cell of CMOS type which requires a p-type well and an n-type well in a memory cell. Accordingly, a high resistance load type memory cell is advantageous for high densification SRAM.

However, in the high resistance load type memory cell, current is supplied from supply potential Vcc through high resistance loads HR1, HR2 for maintaining state of storing data latched by the flip-flop circuit implemented with driver transistors Q3, Q4. It is desired that the current is small for suppressing power consumption during waiting. Therefore, it is necessary make the electrical resistance value of the high resistance loads as high as possible. However, there is a limit to the resistance of the resistance loads, and it is necessary that current flowing in the high resistance loads for holding data is larger than the leakage current in the case where the transistor is off. On the other hand, in the memory cell of CMOS type, current is supplied from supply potential Vcc through load transistors (p-channel MOS transistors) Q5, Q6 for maintaining the state of storing data latched by the flip-flop circuit. Therefore, it is possible to reduce current consumption during waiting to the level of the junction leakage current. As described above, although the high resistance load type memory cell is advantageous for high densification of a SRAM, the memory cell of CMOS type is advantageous for reducing current consumption to hold the state of storing data, i.e. for suppressing power consumption during waiting.

In consideration of the above respects, a structure of a CMOS-type memory cell capable of achieving high densification of a SRAM is proposed. FIG. 18A is a plan view schematically illustrating an arrangement in a memory cell implemented by reducing the occupied flat area in the memory cell of CMOS type illustrated in FIG. 16A. FIG. 18B is a cross sectional view corresponding to FIG. 18A.

Referring to FIGS. 16A and 18A–18B, p-channel thin film transistors (TFTs) are adapted, as load transistors Q5, Q6, instead of bulk-type p-channel MOS transistors. Therefore, as illustrated in FIG. 18A, a region for formation of four n-channel MOS transistors is required for implementing a memory cell. p-channel TFTs constituting load transistors Q5, Q6 are formed on n-channel MOS transistors constituting driver transistors Q3, Q4. As illustrated in FIG. 18B, four bulk-type n-channel MOS transistors are formed in a p-type well region (p-Well). If p-channel TFTs are adapted as load transistors like this, only a p-type well region is required for forming one memory cell. Therefore, it is possible to reduce the flat area occupied by a memory cell CMOS type and to provide a structure of a memory cell of CMOS type advantageous for high densification by adapting a p-channel TFT.

A memory cell in a SRAM of CMOS type in which a p-channel TFT including a polycrystalline silicon layer is adapted as a load transistor is disclosed in "A 25 $\mu m^2$ New Poly-Si PMOS Load (PPL) SRAM Cell Having Excellent Soft Error Immunity" IEDM, 1988, pp. 48–51. FIG. 19 is a partial plan view illustrating an arrangement in only the upper layer part in such a memory cell in a SRAM. FIG. 20 is a partial cross sectional view illustrating a cross sectional structure taken along line XX—XX in FIG. 19. FIGS. 21A–21C are partial cross sectional views illustrating a method of manufacturing the memory cell illustrated in FIG. 20, particularly, sequentially illustrating cross sectional structures in respective steps of a method of forming a p-channel TFT constituting a load transistor.

Referring to FIGS. 19 and 20, an n-type well region 502 and a p-type well region 503 are sequentially formed on a p-type silicon substrate 501. An $n^+$ impurity region 209 of an n-channel MOS transistor constituting a driver transistor or an access transistor is formed in p-type well region 503. An isolating oxide film 200 is formed for isolating each n-channel MOS transistor. Gate electrodes 201, 202 of a first polycrystalline silicon layer are formed on p-type well region 503 with a gate insulating film 210 interposed therebetween. Gate electrodes 201, 202 constitute the gate of an access transistor or a driver transistor. A gate electrode 204 of a second polycrystalline silicon layer is formed on gate electrodes 201, 202 with an insulating film interposed therebetween. Gate electrode 204 constitutes the gates of p-channel TFTs as load transistors Q5, Q6. A source region 206a, a channel region 206, and a drain region 206b of a TFT of a third polycrystalline silicon layer are formed on gate electrode 204 with a gate insulating film 212 interposed therebetween. Source region 206a of the TFT constitutes power supply interconnection line Vcc. Drain region 206b of each TFT is connected through a contact hole 205 to gate electrode 204 of another TFT. An interlayer insulating film 214 is formed to cover each transistor. A refractory metal layer 207a is formed to be in contact with $n^+$ impurity region 209 through a contact hole 208. An interlayer insulating 216 is formed on refractory metal layer 207a. An aluminum metal layer 207b is connected to refractory metal layer 207a. A bit line is constituted with aluminum metal layer 207b.

A method of manufacturing the memory cell in a SRAM formed as described above, particularly a method of manufacturing a p-channel TFT, will be described with reference to FIGS. 21A–21C.

Referring to FIG. 21A, an isolating oxide film 200, an $n^+$ impurity region 209, a gate insulating film 210 and gate electrodes 201, 202 are formed in a p-type well region 503 to constitute a driver transistor or an access transistor. An interlayer insulating film 211 is formed to cover each transistor. A second layer of a polycrystalline silicon layer is formed on interlayer insulating film 211 by a low pressure CVD process, for example. Arsenic ions are implanted into the polycrystalline silicon layer, and then the polycrystalline silicon layer is patterned to form a gale electrode 204 of a p-channel TFT which constitutes a load transistor. Gate electrode 204 is formed to be connected to gate electrode 202 of a driver transistor in a part.

Then, as illustrated in FIG. 21B, an oxide film, for example, which constitutes a gate insulating film 212 is formed on the whole surface by a low pressure CVD process. Gate insulating film 212 is patterned as needed, and then a third layer of a polycrystalline silicon layer is formed by a low pressure CVD process, for example. The polycrystalline silicon layer is patterned to form a polycrystalline silicon layer 206 to be source, channel and drain regions of a TFT. A region of polycrystalline silicon layer 206 corresponding to the drain region of the TFT is connected to gate electrode 204 of another TFT.

As illustrated in FIG. 21C, a photoresist film 217 is formed only on a part of polycrystalline silicon layer 206 corresponding to the channel region. $BF_2$, for example, is introduced into polycrystalline silicon layer 206 by ion implantation using photoresist film 217 as a mask. Then, photoresist film 217 is removed, and heat treatment is carried out so that boron is diffused in polycrystalline silicon layer 206. A source region 206a and a drain region 206b are formed by this.

A SRAM is characterized by smaller power consumption as compared with that of a DRAM. Therefore, a SRAM is used in portable type computer or word processor, an IC card, and the like, apart from general electronic equipment. These portable products are used with batteries, so that the power consumption of a SRAM must be made lower.

In the case of a conventional SRAM using a high resistance load type memory cell, it is necessary to increase the resistance value of a load in order to reduce the power consumption. However, if the resistance value is increased, there is the disadvantage that the stability of a memory cell is lowered, and the stored contents are changed. On the other hand, in the case of a SRAM using a memory cell adopting a TFT as a load transistor, there is the advantage that both of low power consumption and stability of a memory cell can be achieved. Therefore, a SRAM with a high performance is provided by providing a TFT with a high performance. In order to provide a TFT with a high performance, it is necessary to provide a TFT having characteristics as described in the following.

As illustrated in FIG. 19, source region 206a of the TFT also serves as power supply interconnection line Vcc. Therefore, it is necessary to suitably lower the electrical conduction resistance of the source region. In order to achieve this, it is necessary to raise the impurity concentration of the source/drain regions of the TFT. However, if the impurity concentration of the source/drain regions is made higher, the electric field at the junction of the channel region and the drain region becomes stronger, more electrons tend to flow from the drain region to the channel region, so that the leakage current is increased, and this is a problem. If the leakage current in OFF state of a TFT constituting a load transistor is increased, current for holding the state of storing data, i.e. power consumption during waiting is increased. In other words, the drain current in the case where a TFT constituting a load transistor is in OFF state is increased. On the other hand, if the impurity concentration of the source/drain region is lowered for reducing the leakage current, there is a problem of higher electrical conducting resistance of the interconnection region constituting the power supply interconnection line or the like, which deteriorates the operational performance of the SRAM. As described above, when a p-channel TFT is applied to a CMOS-type SRAM memory cell, it is necessary to make the leakage current in the nonoperating state of the TFT as small as possible for making power consumption during waiting as small as possible.

Referring to FIG. 16A, when memory cell node N1 has a potential at "High" level, and memory cell node N2 has a potential at "Low" level, driver transistor Q3 is in OFF state, and driver transistor Q4 is in ON state. At this time, a potential at "Low" level is applied to the gate electrode of load transistor Q5 implemented with a p-channel TFT, so that load transistor Q5 is in ON state. A potential at "High" level is applied to the gate electrode of load transistor Q6 implemented with a p-channel TFT, so that load transistor Q6 is in OFF state. Memory cell node N1 is charged from power supply Vcc through load transistor Q5 in ON state, so that its potential is kept at "High" level. Leakage current is supplied from power supply Vcc through load transistor Q6 in OFF state to memory cell node N2, so that its potential is kept at "Low" level. Thus, data can be held.

In this case, driver transistor Q3 in OFF state is implemented with a bulk-type n-channel MOS transistor formed on a semiconductor substrate, so that leakage current is generated in driver transistor Q3 because of generation of a noise charge caused by alpha rays or the like from the outside. Therefore, the potential of memory cell node N1 is a little lower than "High" level. In order to counteract the effects of generation of the noise charge, it is necessary to increase the current supplied for keeping the potential of memory cell node N1 at "High" level, i.e. the drain current of load transistor Q5 in ON state. Accordingly, when a load transistor is implemented with a p-channel TFT, it is necessary to form the TFT so that the drain current during operation is as large as possible for stabilizing the data holding characteristic.

Furthermore, as illustrated in FIG. 21C, the positional relation between gate electrode 204 of a p-channel TFT and source/drain regions 206a, 206b is determined by the position of photoresist film 217 formed by a photolithography technique. Therefore, there is a problem that source/drain regions 206a, 206b cannot be formed in a self-align manner with gate electrode 204.

SUMMARY OF THE INVENTION

An object of the present invention is to provide a field effect thin film transistor in which drain current is large in the operating state, and leakage current is as small as possible in the nonoperating state.

Another object of the present invention is to reduce power consumption in a waiting state in a static-type semiconductor memory device having a thin film transistor as a load transistor.

Still another object of the present invention is to stabilize the data holding characteristic in a static-type semiconductor memory device having a thin film transistor as a load transistor.

A further object of the present invention is to fabricate a field effect thin film transistor in which drain current is large in the operating state and leakage current is as small as possible in the nonoperating state.

A still further object of the present invention is to fabricate a field effect thin film transistor so that an impurity region is formed in a self-align manner with a gate electrode.

Still a further object of the present invention is to fabricate a static-type semiconductor memory device having a thin film transistor as a load transistor and capable of reducing power consumption in a waiting state.

Another object of the present invention is to fabricate a static-type semiconductor memory device having a thin film transistor as a load transistor and capable of stabilizing the data holding characteristic.

A field effect transistor according to an aspect of the present invention includes a gate electrode, a gate insulating film, a thin semiconductor film, and two impurity regions. The gate electrode is formed on an insulator. The gate insulating film is formed on the gate electrode. The thin semiconductor film is formed on the gate insulating film. A portion of the thin semiconductor film forms a channel region. The two impurity regions are formed in portions of the thin semiconductor film separated by the channel region. At least one of the two impurity regions includes a first impurity region and a second impurity region. The first impurity region is close to the gate electrode and has impurities of a first concentration. The second impurity region is adjacent to the first impurity region and has impurities of a second concentration which is higher than the first concentration.

At least one of the impurity regions included in the field effect transistor in accordance with this aspect of the present invention includes an impurity region of low concentration and an impurity region of high concentration adjacent to the impurity region of low concentration. Therefore, the electric field at the junction of the channel and drain is relaxed, and the amount of electrons flowing from the drain region into the channel region is reduced. As a result, the leakage current in the nonoperating state is reduced. In addition, since at least one of the impurity regions of the field effect transistor includes a region of low concentration and a region of high concentration, the drain current in the operating state is increased.

A semiconductor device according to another aspect of the present invention includes a first conductivity-type semiconductor substrate, a second conductivity-type field effect transistor, and a first conductivity-type field effect transistor. The second conductivity-type field effect transistor is formed on a main surface of the semiconductor substrate. The first conductivity-type field effect transistor is electrically connected to the second conductivity-type field effect transistor. The first conductivity-type field effect transistor includes a gate electrode, a gate insulating film, a thin semiconductor film, and first conductivity-type two impurity regions. The gate electrode is formed above the second conductivity-type field effect transistor. The gate insulating film is formed on the gate electrode. The thin semiconductor film is formed on the gate insulating film. A portion of the thin semiconductor film forms a channel region. The first conductivity-type two impurity regions are formed in portions of the thin semiconductor film separated by the channel region. At least one of the two impurity regions includes a first impurity region and a second impurity region. The first impurity region is close to the gate electrode and has first conductivity-type impurities of a first concentration. The second impurity region is adjacent to the first impurity region and has first conductivity-type impurities of a second concentration which is higher than first concentration.

Since the static-type semiconductor memory device in accordance with this aspect of the present invention includes the field effect transistor formed as described above, it is possible to reduce the minimum current for holding storage of data to the level of the leakage current of the above-described field effect transistor. Therefore, it becomes possible to make the power consumption in the waiting state of the static-type semiconductor memory device as small as possible. In addition, by using the field effect transistor formed as described above, it is possible to obtain larger current for holding the state of storing data from the above-described field effect transistor in the operating state. Accordingly, it is possible to stabilize the data holding characteristic of the static-type semiconductor memory device.

According to a method of manufacturing a field effect transistor in accordance with a still another aspect of the present invention, first, a gate electrode is formed on an insulator. A gate insulating film is formed on the gate electrode. A thin semiconductor film is formed on the gate insulating film. A first insulating film is formed on the semiconductor film to have a first thickness in a region on the gate electrode and to have a second thickness smaller than the first thickness in a region other than the region on the gate electrode. Impurities are ion-implanted through the first insulating film in the semiconductor film to form a first impurity region including impurities of a first concentration in the region other than the region on the gate electrode. A second insulating film is selectively formed on the first insulating film to have at least the first thickness in a part of the first impurity region close to the gate electrode. Impurities are ion-implanted through the first insulating film and the second insulating film in the semiconductor film to form a second impurity region including impurities of a second concentration higher than the first concentration in the first impurity region except the above-described part.

According to a method of manufacturing a semiconductor device in accordance with a further aspect of the present invention, first, a second conductivity-type field effect transistor having a connecting terminal is formed on a main surface of a first conductivity-type semiconductor substrate. An insulating layer is formed to cover the second conductivity-type field effect transistor. A through-hole is formed in the insulating layer to expose a surface of the connecting terminal of the second conductivity-type field effect transistor. A gate electrode is formed on the insulating layer. A gate insulating film is formed on the gate electrode. A thin semiconductor film is formed on the gate insulating film to be electrically connected to the connecting terminal through the through-hole. A first insulating film is formed on the semiconductor film to have a first thickness in a region on the gate electrode and to have a second thickness smaller than the first thickness in a region other than the region on the gate electrode. Impurities are ion-implanted through the first insulating film in the semiconductor film to form a first impurity region including first conductivity-type impurities of a first concentration in the region other than the region on the gate electrode. A second insulating film is selectively formed on the first insulating film to have at least first thickness in a part of the first impurity region close to the gate electrode. Impurities are ion-implanted through the first insulating film and the second insulating film in the semiconductor film to form a second impurity region including first conductivity-type impurities of a second concentration higher than the first concentration in the first impurity region except above-described part.

Furthermore, according to the methods of manufacturing the field effect transistor or the static-type semiconductor memory device in accordance with the lastly mentioned two aspects of the present invention, impurities are ion-implanted through an insulating film whose thickness in the region on a gate electrode is different from that in the other region to form an impurity region to form the field effect transistor. Therefore, the impurity region can be formed in a self-align manner with the gate electrode.

As described above, according to the present invention, it is possible to obtain a SRAM with low power consumption, which is capable of decreasing frequency of error in stored data, which has a superior data holding characteristic, and which can be used in a portable type computer or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in the following with reference to the drawings.

Figure 1:
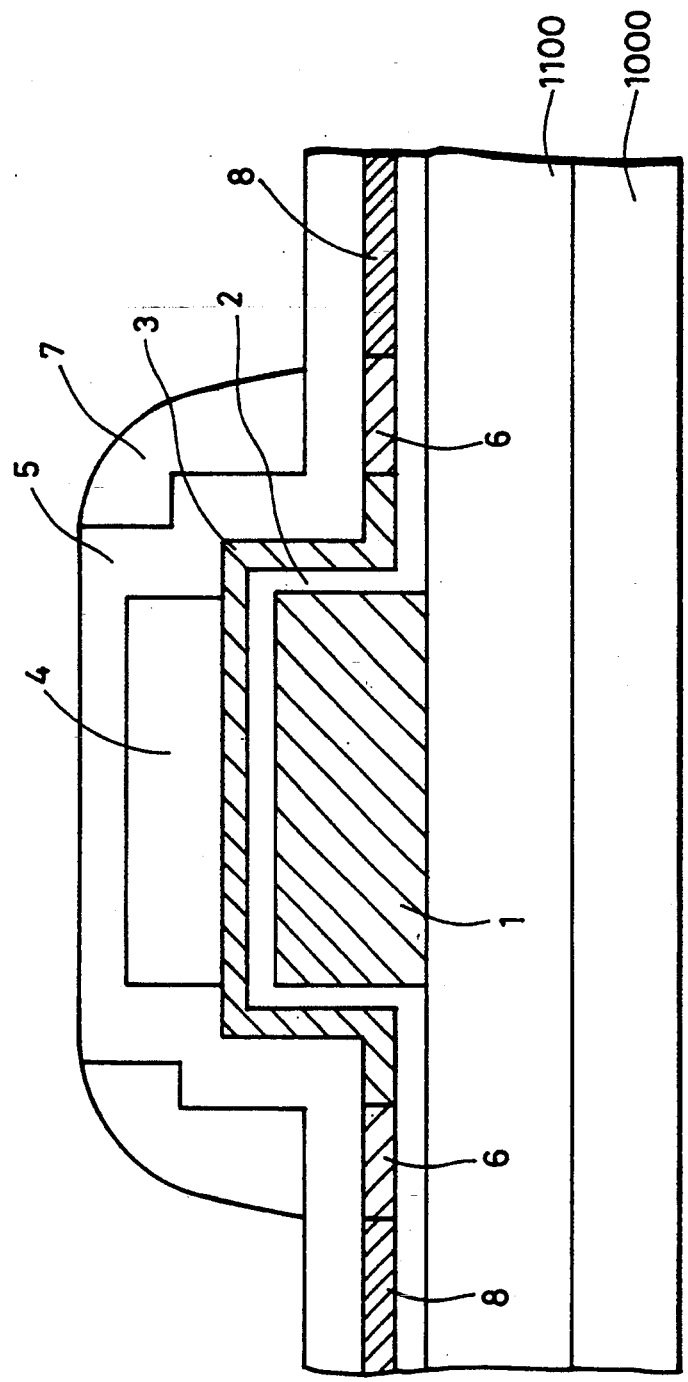
FIG. 1 is a cross sectional view illustrating a cross sectional structure of a thin film transistor as a field effect transistor according to an embodiment of the present invention.

Referring to FIG. 1, a gate electrode 1 of a first polycrystalline silicon film is formed on an insulator 1100. The insulator 1100 is formed on a silicon substrate 1000. A gate insulating film 2 of an oxide film is formed on gate electrode 1 and on insulator 1100 to cover gate electrode 1. A second polycrystalline silicon film 3 is formed on gate insulating film 2. A lower layer insulating film 4 is formed on second polycrystalline silicon film 3. Lower layer insulating film 4 is formed to have the same shape in plan view as gate electrode 1. An upper layer insulating film 5 is formed on lower layer insulating film 4 and on second polycrystalline silicon film 3 to cover lower layer insulating film 4. Sidewall insulating films 7 are formed on the sidewall parts of upper layer insulating film 5. Source/drain regions 6 of low concentration are formed in second polycrystalline silicon film 3 to be positioned just under sidewall insulating films 7, respectively. Source/drain regions 8 of high concentration are formed in second polycrystalline silicon film 3 to be adjacent to source/drain regions 6 of low concentration, respectively. A channel region is formed between the two source/drain regions 6 of low concentration in second polycrystalline silicon film 3. In a TFT illustrated in FIG. 1, the channel region is not only on the top surface of gate electrode 1 but also on the side surfaces of gate electrode 1 with gate insulating film 2 interposed therebetween. However, the channel region may exist only on the top surface of gate electrode 1 with gate insulating film 2 interposed therebetween, and the channel region is only required to be positioned at least between the two source/drain regions 6 and to exist on gate electrode 1 with gate insulating film 2 interposed therebetween.

Figure 2A:
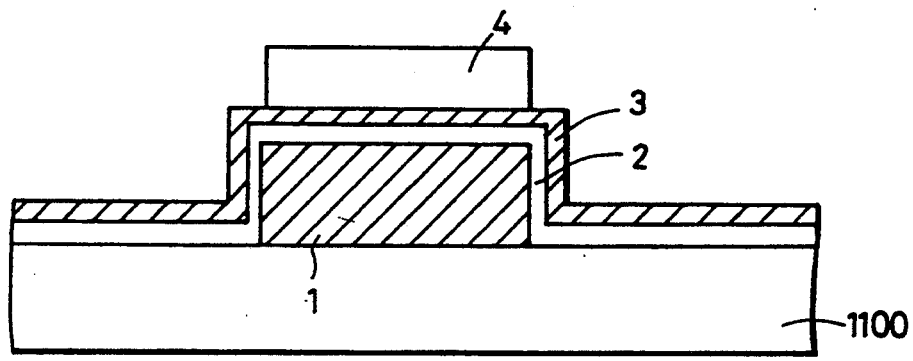
FIGS. 2A–2C are cross sectional views sequentially illustrating cross sectional structures of a thin film transistor as a field effect transistor in respective steps of a manufacturing process according to an embodiment of the present invention.
Figure 2B:
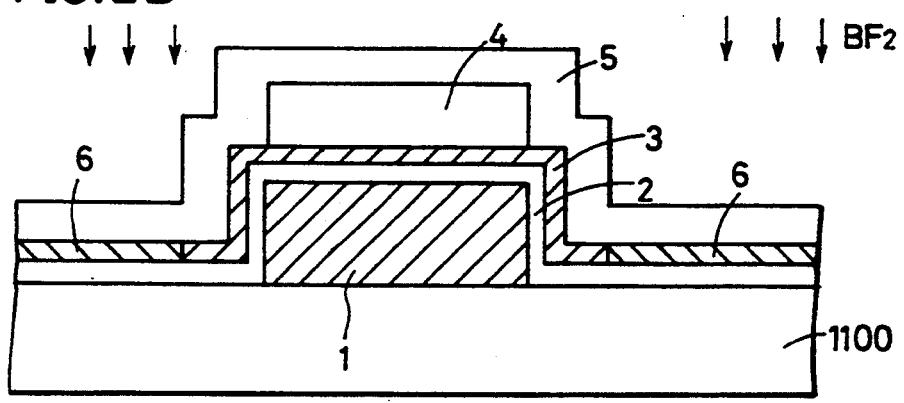
Figure 2C:
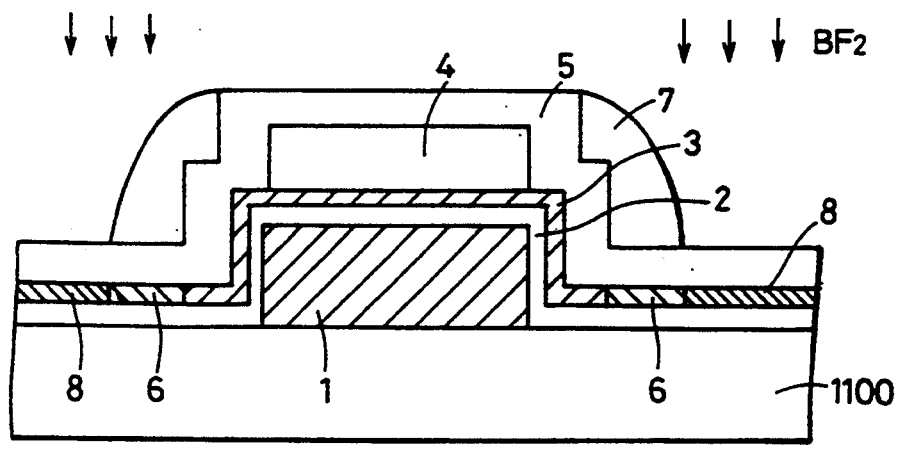

FIGS. 2A–2C are cross sectional views illustrating cross sectional structures of a TFT formed as described above in respective steps of a method of manufacturing the same.

Referring to FIG. 2A, active elements and interconnection are formed on a silicon substrate by a conventional method, and an insulating film is formed thereon. An insulator 1100 is illustrated as the insulating film in FIG. 2A. A first polycrystalline silicon film is formed with a thickness of approximately 1500 Å on insulator 1100 using a low pressure CVD process, for example. The first polycrystalline silicon film is patterned to form a gate electrode 1. Then, an oxide film, for example, which is to form a gate insulating film 2 is formed on the whole surface by a low pressure CVD process. The oxide film is patterned as needed to form gate insulating film 2. The thickness of gate insulating film 2 is approximately 250 Å. A second polycrystalline silicon film 3 is formed on gate insulating film 2 using a low pressure CVD process, for example. Second polycrystalline silicon film 3 is patterned into a desired shape using a photolithography technique. The thickness of second polycrystalline silicon film 3 is approximately 200 Å. An insulating film 4 of an oxide film is formed on second polycrystalline silicon film 3 using a low pressure CVD process. Insulating film 4 is patterned to have the same planar shape in plan view as gate electrode 1 using a photolithography technique. The thickness of insulating film 4 is approximately 1000 Å.

Then, referring to FIG. 2B, an upper layer insulating film 5 of an oxide film is formed on the whole surface using a low pressure CVD process, for example. p-type impurities, for example, $BF_2$, of a dose in the range of approximately $10^{12}/cm^2$ to approximately $10^{13}/cm^2$ are implanted from the upper end of the insulating film by an ion implantation process. The thickness of upper layer insulating film 5 is approximately 500 Å. At this time, the implantation energy is set so that ions pass the thickness of upper layer insulating film 5 but does not pass the thickness of the sum of the thickness of lower layer insulating film 4 and that of upper layer insulating film 5. The ion implantation of impurities causes the impurities to be implanted only into polycrystalline silicon film 3 positioned at both sides of steps of upper layer insulating film 5 formed by steps of gate electrode 1. Accordingly, heat treatment in a later step causes p-type source/drain regions 6 having concentration in the range of about $10^{15}/cm^3$ to about $10^{16}/cm^3$ to be formed in polycrystalline silicon film 3. Source/drain regions 6 of low concentration is offset to gate electrode 1 by the thickness of upper layer insulating film 5 formed by the steps of gate electrode 1. However, they serve to control reduction of the effective channel length caused by diffusion of impurities when impurities are diffused in heat treatment after formation of the transistor.

As illustrated in FIG. 2C, first, an insulating film of an oxide film is deposited on the whole surface using a low pressure CVD process. The insulating film is removed by a thickness corresponding to the deposition thickness of it using an anisotropic etching technique to leave the insulating film only on the sidewalls of upper layer insulating film 5. This causes sidewall insulating films 7 to be formed remaining in the shape of a frame along the step parts formed by gate electrode 1, lower layer insulating film 4, and upper layer insulating film 5. The width of sidewall insulating films 7 is approximately 2000 Å. Then, p-type impurities, for example, $BF_2$, of a dose in the range of $10^{14}/cm^2$ to $10^{15}/cm^2$ are implanted by an ion implantation process. At this time, the implantation energy is set so that ions pass the thickness of upper layer insulating film 5 but does not pass the thickness of the sum of the thickness of lower layer insulating film 4 and that of upper layer insulating film 5. This causes the impurities to be implanted only into polycrystalline silicon film 3 on both sides of the steps of sidewall insulating films 7. Heat treatment in a later step forms p-type source/drain regions 8 of high concentration having impurity concentration in the range of approximately $10^{18}/cm^3$ to approximately $10^{19}/cm^3$. Thus, it is possible to form source/drain regions 6 of low concentration and source/drain regions 8 of high concentration in a self-align manner with gate electrode 1 by controlling the thickness of the insulating film formed on polycrystalline silicon film 3 and by controlling the ion implantation energy in accordance with the controlled thickness.

Figure 3:
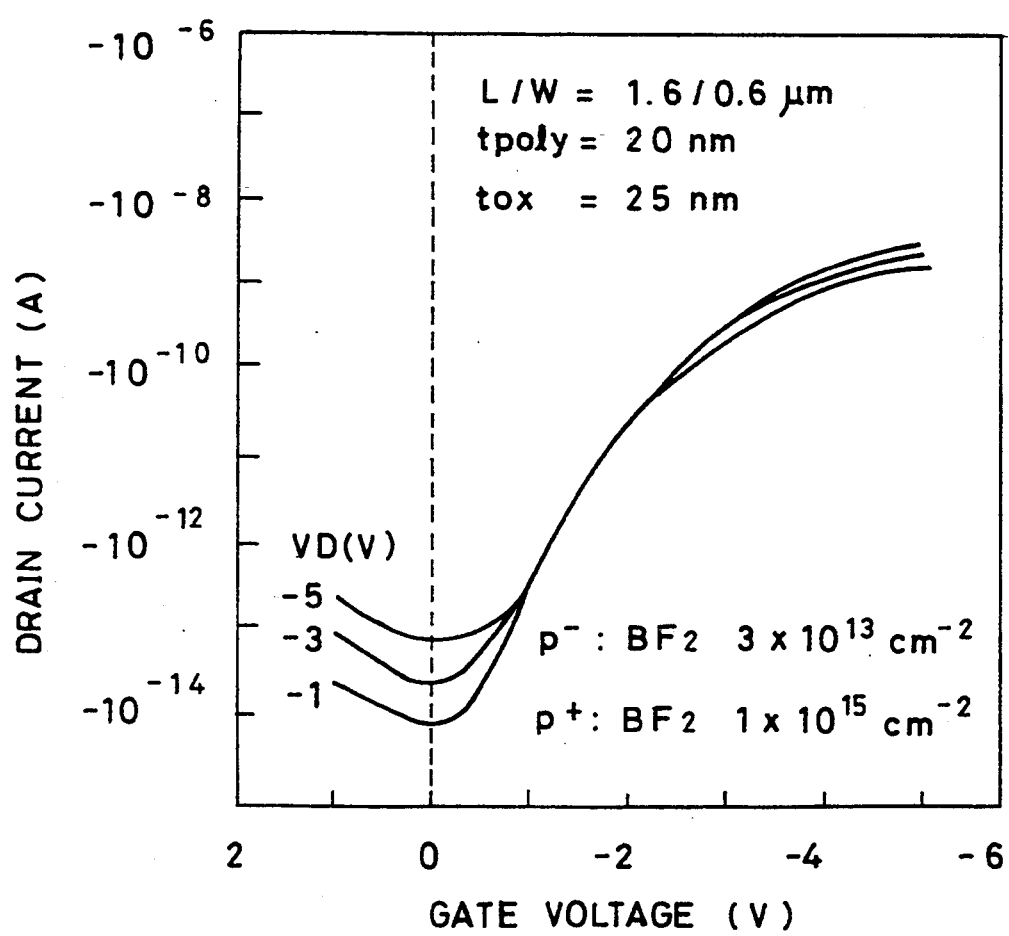
FIG. 3 is a graph showing the relation between the gate voltage and the drain current of a p-channel thin film transistor according to an embodiment of the present invention.

FIG. 3 is a graph showing the relation between the gate voltage and the drain current of a p-channel TFT formed as described above. The amount of ions implanted for forming source/drain regions 6 of low concentration is set to $3 \times 10^{13}$ cm$^{-2}$, and the amount of ions implanted for forming source/drain regions 8 of high concentration is set to $1 \times 10^{15}/cm^{-2}$. The thickness ($t_{ox}$) of the gate oxide film is 25 nm, and the thickness ($t_{poly}$) of the polycrystalline silicon film to form the source, channel, and drain regions is 20 nm. The ratio of the channel length to the channel width (L/W) is 1.6 μm /0.6 μm . Even if the drain voltage ($V_D$) Of the p-channel TFT changes from $-1$ V to $-5$ V under the above conditions, the leakage current in the nonoperating state, i.e. the drain current in the case where the gate voltage is 0 V shows a value of $-10^{-13}$ A or less. In addition, the drain current in the operating state, for example, in the case where the gate voltage is $-5$ V shows a value of $-10^{-9}$ A or more.

Figure 4:
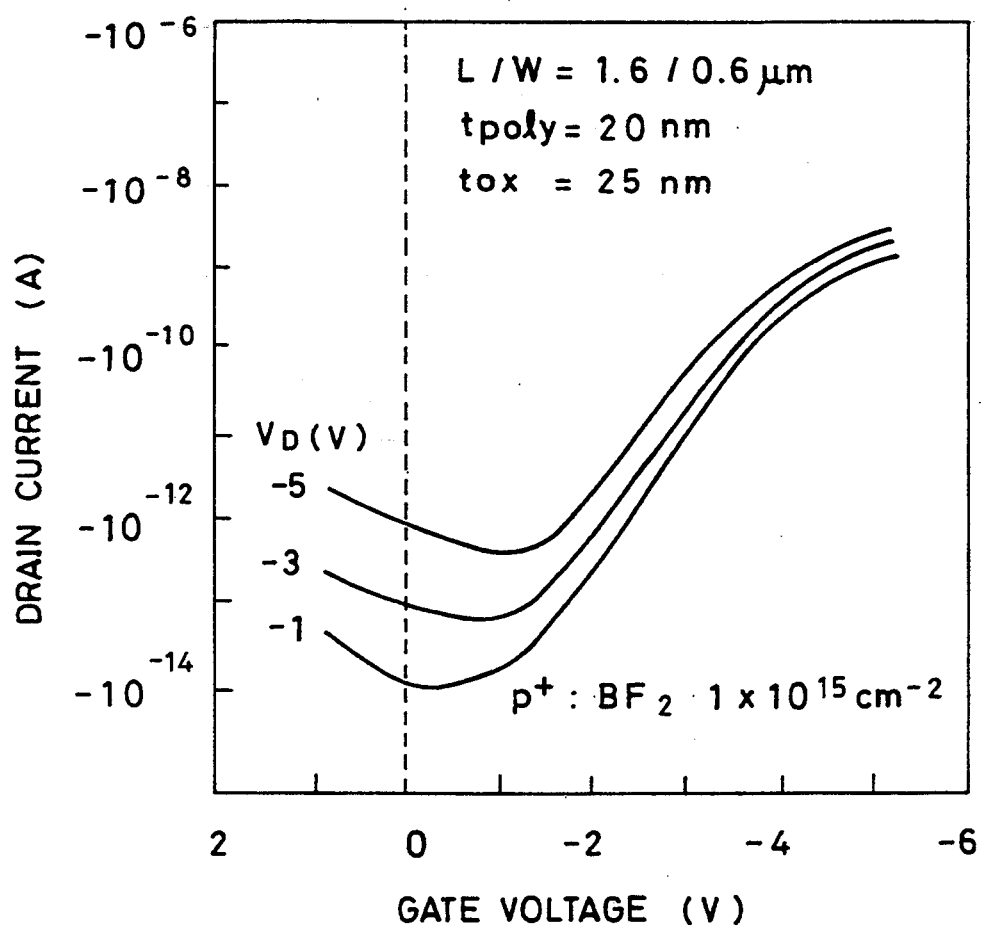
FIG. 4 is a graph showing the relation between the gate voltage and the drain current of a p-channel thin film transistor as a first example for comparison of the present invention.

FIG. 4 is a graph showing the relation between the gate voltage and the drain current in a case where the source/drain regions in a p-channel TFT are formed only of regions of high concentration (the amount of ions implanted is $1 \times 10^{15}$cm$^{-2}$) as an example for comparison with this. Referring to FIG. 4, the value of the leakage current in the nonoperating state, i.e. the value of drain current in the case where the gate voltage is 0 v is a high value of approximately $-10^{-12}$ A when the drain voltage ($V_D$) is $-5$ V. On the other hand, the drain current in the operating state, for example, in the case where the gate voltage is $-5$ V, is a high value of $-10^{-9}$ or more.

Figure 5:
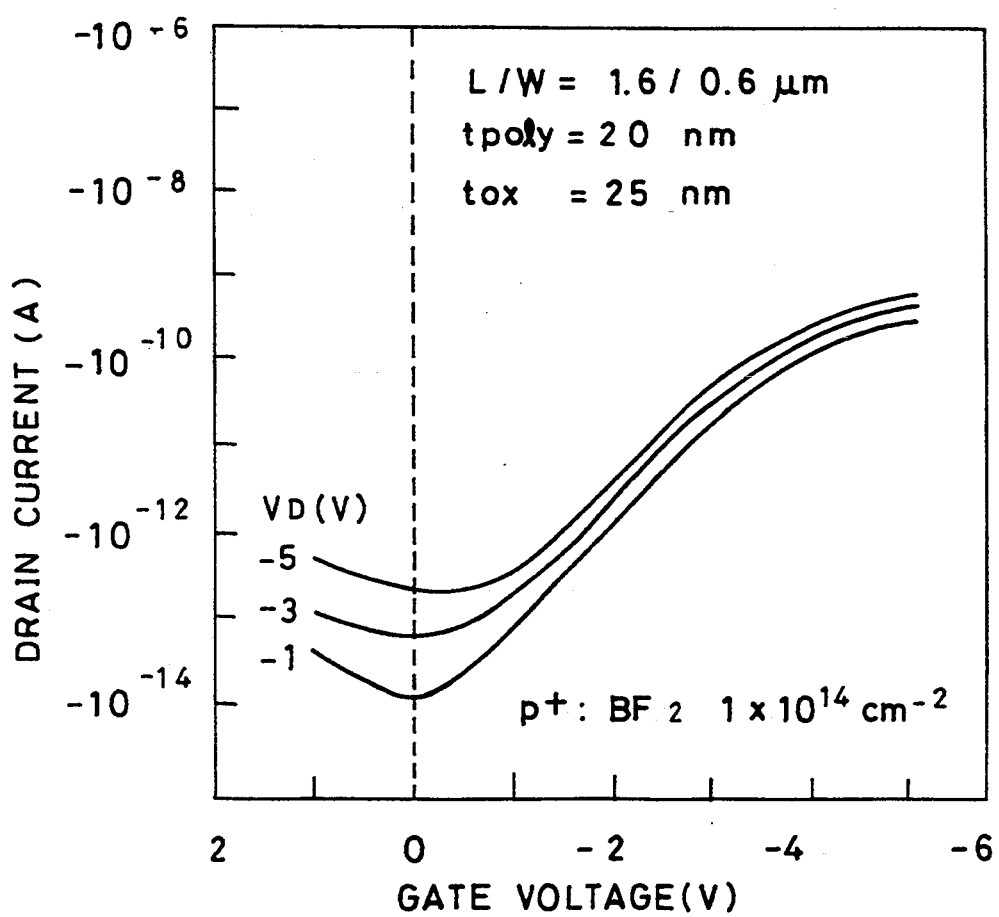
FIG. 5 is a graph showing the relation between the gate voltage and the drain current of a p-channel thin film transistor as a second example for comparison of the present invention.

FIG. 5 is a graph showing the relation between the gate voltage and the drain current in a case where the source/drain regions in a p-channel TFT are formed only of regions of medium concentration (the amount of ions implanted $1 \times 10^{14}$ cm$^{-2}$) as an example for comparison. Referring to FIG. 5, while the value of the drain current in the case where the gate voltage is 0 V is a low value of $-10^{-12}$ A or less, the value of the drain current in the operating state, for example, in the case where the gate voltage is $-5$ V, is a low value of $-10^{-9}$ or less.

As described above, according to a p-channel TFT of the present invention, the leakage current is extremely low in the nonoperating state, and the drain current is high in the operating state.

Figure 6:
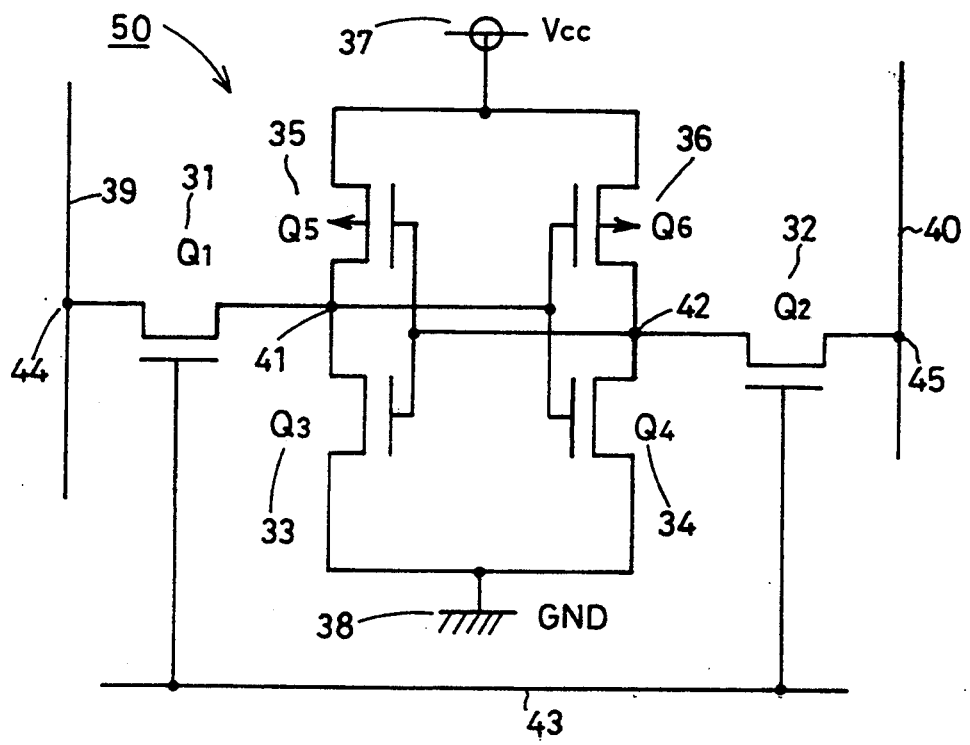
FIG. 6 is an equivalent circuit diagram illustrating one memory cell in a CMOS-type SRAM to which a thin film transistor of the present invention is applied.
Figure 7:
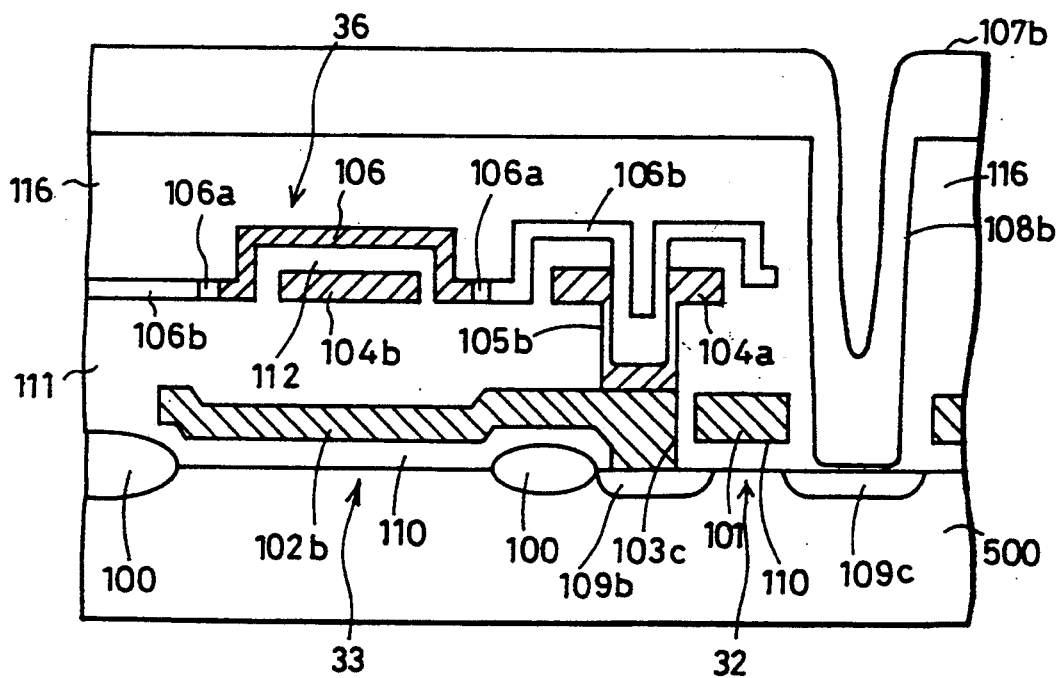
FIG. 7 is a partial cross sectional view illustrating a cross sectional structure of a memory cell in a SRAM according to an embodiment of the present invention.
Figure 8:
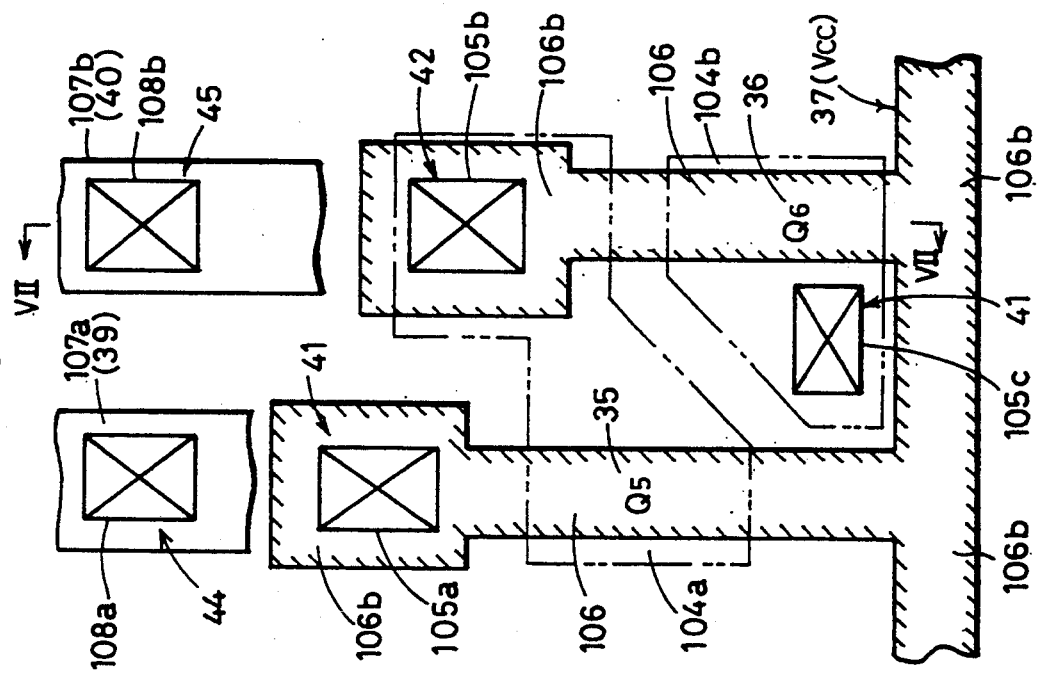
FIG. 8 is a partial plan view illustrating an arrangement in an upper layer part in a memory cell in a SRAM according to an embodiment of the present invention.
Figure 9:
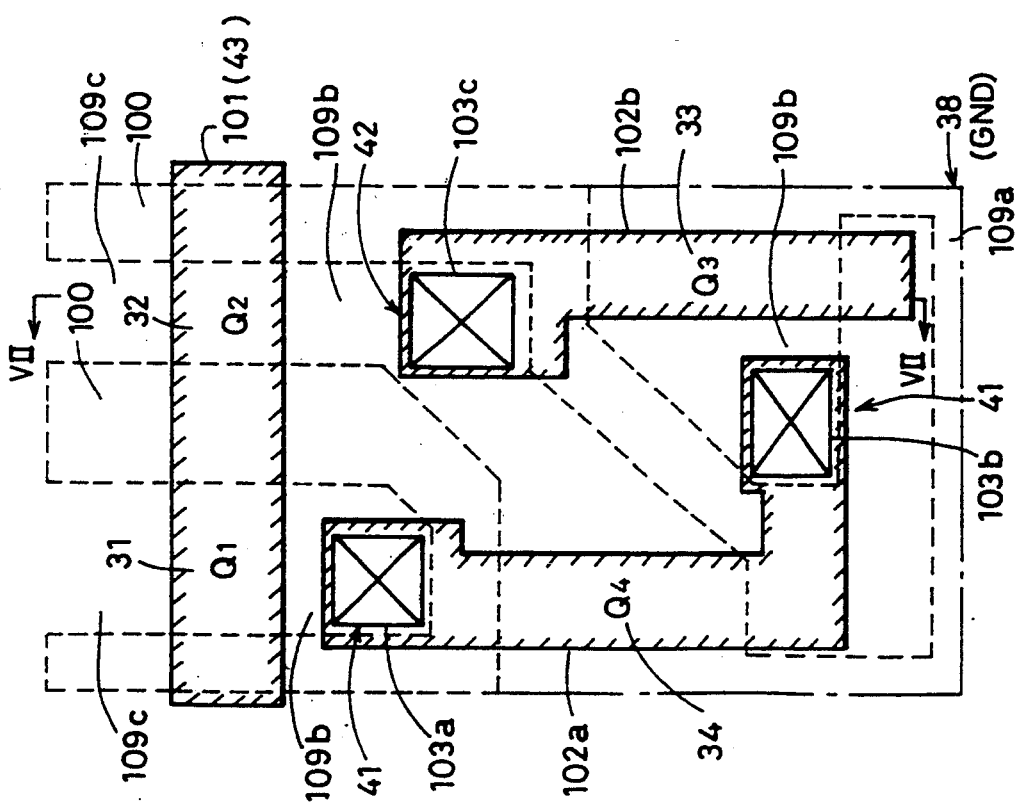
FIG. 9 is a partial plan view illustrating an arrangement in a lower layer part in a memory cell in a SRAM according to an embodiment of the present invention.

FIG. 6 is an equivalent circuit diagram illustrating a memory cell in a SRAM to which a p-channel TFT of the present invention is applied. FIG. 7 is a partial cross sectional view illustrating a cross sectional structure of a memory cell in a SRAM according to an embodiment of the present invention. FIG. 8 is a partial plan view illustrating an arrangement in an upper layer part in a memory cell in a SRAM according to an embodiment of the present invention. FIG. 9 is a partial plan view illustrating an arrangement in a lower layer part in a memory cell in a SRAM according to an embodiment of the present invention. The cross sectional structure illustrated in FIG. 7 corresponds to a cross section taken along lines VII—VII in FIGS. 8 and 9.

Referring to FIG. 6, in a memory cell 50 in a CMOS-type SRAM in accordance with the present invention, a flip-flop type memory cell is formed, including two n-channel MOS transistors (Q3, Q4) 33, 34 as driver transistors having the gate electrodes and drain electrodes cross-coupled, respectively, and two p-channel TFTs (Q5, Q6) 35, 36 as load transistors connected to the drain electrodes of the driver transistors, respectively. Two n-channel MOS transistors (Q1, Q2) 31, 32 as access transistors are connected to the drain electrodes of two n-channel MOS transistors 33, 34, respectively. The gate electrodes of n-channel MOS transistors 31, 32 are connected to a word line 43. When word line 43 is selected, data held in n-channel MOS transistors 33, 34 are transferred through n-channel MOS transistors 31, 32 to bit lines 39, 40, respectively. A memory cell node 41 is connected to the drain electrode of n-channel MOS transistor 33, to the gate electrode of n-channel MOS transistor 34, to the drain electrode of p-channel TFT 35, and to the gate electrode of p-channel TFT 36. Another memory cell node 42 is connected to the gate electrode of n-channel MOS transistor 33, to the drain electrode of n-channel MOS transistor 34, to the gate electrode of p-channel TFT 35, and to the drain electrode of p-channel TFT 36. N-channel MOS transistors 31, 32 are connected through connection points 44, 45 to bit lines 39, 40, respectively. The source electrodes of n-channel MOS transistors 33, 34 are connected to a ground potential 38. The drain electrodes of n-channel MOS transistors 33, 34 are connected to the drain electrodes of p-channel TFTs 35, 36, respectively. The source electrodes of p-channel TFT 35, 36 are connected to a supply potential 37.

Referring to FIGS. 7 and 9, n+ impurity regions 109a, 109b, and 109c of an n-channel MOS transistor are formed in a p-type well region 500. An isolating oxide film 100 is formed in p-type well region 500 for isolating each n+impurity region. Gate electrodes 101, 102a, and 102b of the n-channel MOS transistor are formed on p-type well region 500 with a gate insulating film 100 interposed therebetween. Gate electrodes 102a, 102b are connected through respective buried contacts 103a, 103b, and 103c to n+ impurity region 109b. Connection parts of memory cell nodes 41, 42 are formed by this.

Then, referring to FIGS. 7 and 8, gate electrodes 104a, 104b of a p-channel TFT are formed of a second polycrystalline silicon film in an upper layer part with an interlayer insulating film 111 interposed therebetween. A gate insulating film 112 is formed on gate electrodes 104a, 104b. A third polycrystalline silicon film 106 to form the source, channel and drain regions of the p-channel TFT is formed on gate insulating film 112. As illustrated in FIG. 7, source/drain regions 106a of low concentration and source/drain regions 106b of high concentration are formed, respectively, in polycrystalline silicon film 106 in the regions on both sides having gate electrodes 104b interposed therebetween. Source/drain regions 106b of high concentration also serve as interconnection regions. As illustrated in FIG. 8, source/drain regions 106b of high concentration formed power supply interconnection line 37. In addition, as illustrated in FIGS. 7 and 8, source/drain regions 106b of high concentration are connected through gate electrode 104a of the p-channel TFT and through a contact hole 105b to gate electrode 102b of the n-channel MOS transistor. Similarly, source/drain regions 106b of high concentration are connected through a contact hole 105a to gate electrode 102a of the n-channel MOS transistor (see FIGS. 8 and 9). Furthermore, gate electrode 104b of the p-channel TFT is connected through a contact hole 105c to gate electrode 102a of the n-channel MOS transistor (see FIGS. 8 and 9). Thus, connection parts of memory cell nodes 41, 42 are formed.

As illustrated in FIG. 7, an interlayer insulating film 116 is formed to cover the p-channel TFT. An aluminum interconnection layer 107b is connected through a contact hole 108b formed in interlayer insulating film 116 to an n+ impurity region 109c of the n-channel MOS transistor. Similarly, as illustrated in FIGS. 8 and 9, an aluminum interconnection layer 107a is connected through a contact hole 108a to impurity region 109c of the n-channel MOS transistor. Thus, connection parts 44, 45 of bit lines 39, 40 and the source/drain regions of access transistors.

Data writing and data reading operations in the memory cell in a CMOS-type SRAM formed as described above are the same as those in the conventional SRAM. Referring to FIG. 6, when the potential of a word line 43 is at "Low" level, each of n-channel MOS transistors 31, 32 is in OFF state. Consideration will be given to the data holding operation, disregarding n-channel MOS transistors 31, 32. For example, when memory cell node 41 has a potential at "High" level, and memory cell node 42 has a potential at "Low" level, n-channel MOS transistor 33 is in OFF state, and n-channel MOS transistor 34 is in ON state. At this time, p-channel TFT 35 is in ON state, and p-channel TFT 36 is in OFF state. A potential at "High" is held at memory cell node 41 by supplying current from a power supply 37 through p-channel TFT 35 in ON state. A potential at "Low" level is held at memory cell node 42 by leakage current supplied from power supply 37 through p-channel TFT 36 in OFF state.

Since the source/drain regions of the p-channel TFT forming the load transistor are formed of region 106a of low concentration and region 106b of high concentration, there is an advantage as described in the following in such data holding operation. First, in the above-described data holding operation, the drain current of p-channel TFT 36 in OFF state can be made extremely small (see FIG. 3). Therefore, it is possible to reduce the minimum current for holding the state of storing data. This means that the power consumption in the waiting state is reduced.

In addition, in the above data holding operation, the drain current of p-channel TFT 35 in ON state becomes larger (see FIG. 3). Therefore, current supplied to bulk-type n-channel MOS transistor 33 becomes larger. This means that even if a charge causes by external noise such as alpha rays or the like is generated in the junction region of n-channel MOS transistor 33 to cause leakage of the current for holding data, current sufficient for enduring it is supplied from p-channel TFT 35. Accordingly, the data holding characteristic is stabilized in the memory cell in a CMOS-type SRAM.

Now, a method of manufacturing the memory cell illustrated in FIG. 7 will be described. FIGS. 10-15 are partial cross sectional views sequentially illustrating cross sectional structures of a memory cell in a SRAM according to an embodiment of the present invention in respective steps of a method of manufacturing the same.

Figure 10:
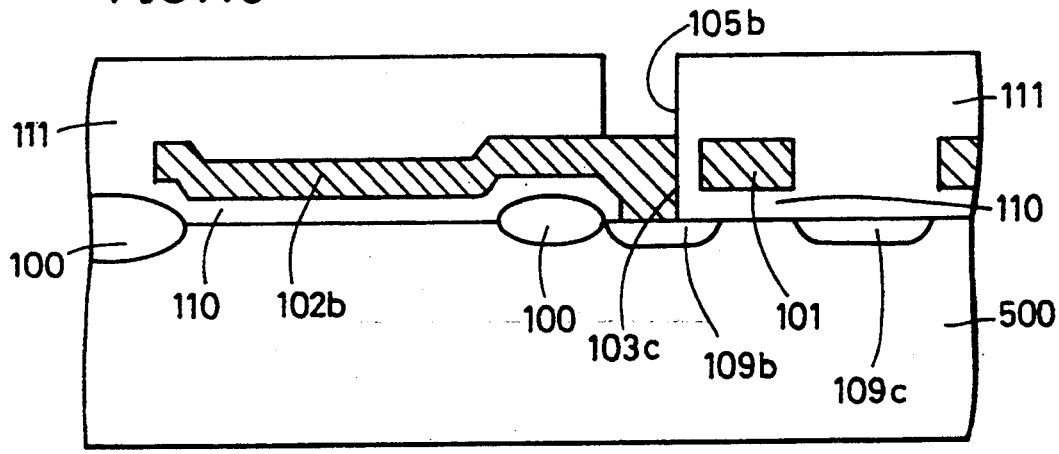
FIGS. 10–15 are partial cross sectional views sequentially illustrating cross sectional structures in respective steps of a method of manufacturing a memory cell in a SRAM according to an embodiment of the present invention.

Referring to FIG. 10, an isolating oxide film 100 is selectively formed in a p-type well region 500 for isolating an element forming region. n+ impurity regions 109b, 109c are formed in p-type well region 500. Gate electrodes 101, 102b of an n-channel MOS transistor are formed of a first polycrystalline silicon film on p-type well region 500 with a gate insulating film 110 interposed therebetween. An interlayer insulating film 111 is formed on gate electrodes 101, 102b. Gate electrode 102b is formed to be in contact with n+ impurity region 109b through a buried contact 103c. A contact hole 105b is formed in interlayer insulating film 111 to expose a part of the surface of gate electrode 102b.

Figure 11:
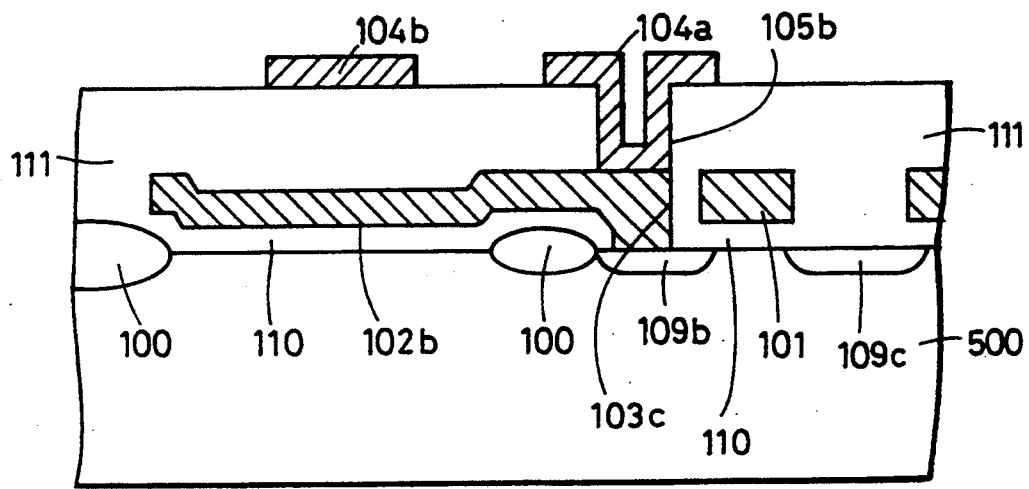

Referring to FIG. 11, a gate electrode 104b of a p-channel TFT is formed of a second polycrystalline silicon film on interlayer insulating film 111. At this time, a gate electrode 104a of the p-channel TFT is formed of a second polycrystalline silicon film to be in contact with the surface of gate electrode 102b exposed by contact hole 105b.

Figure 12:
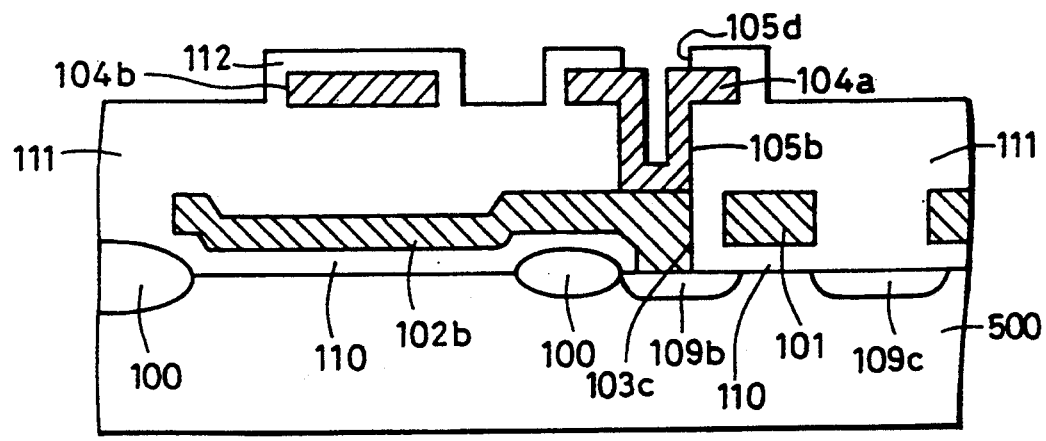

Referring to FIG. 12, a gate insulating film 112 is formed to cover second polycrystalline silicon films 104a, 104b. An opening 105d is provided on second polycrystalline silicon film 104a to communicate with contact hole 105b.

Figure 13:
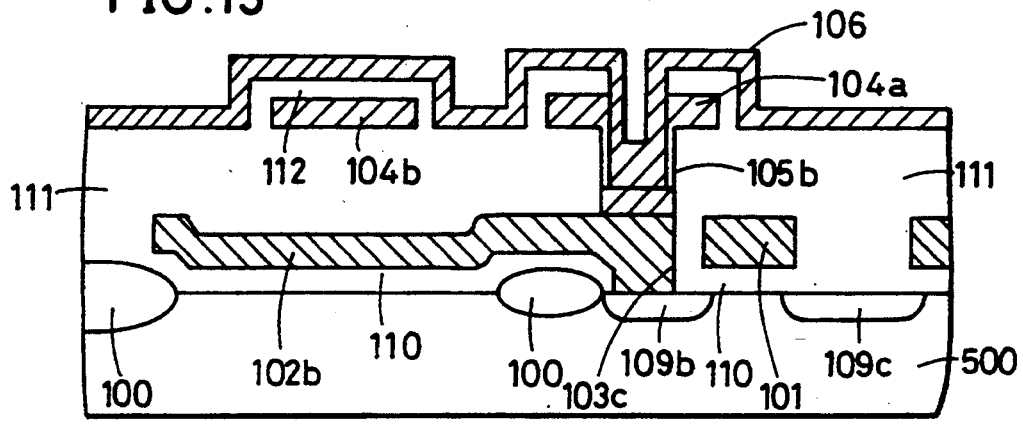

As illustrated in FIG. 13, a part of second polycrystalline silicon film 104a is removed, and then a third polycrystalline silicon film 106, which is to form the source, channel, and drain regions of the p-channel TFT, is formed on gate insulating film 112.

Figure 14:
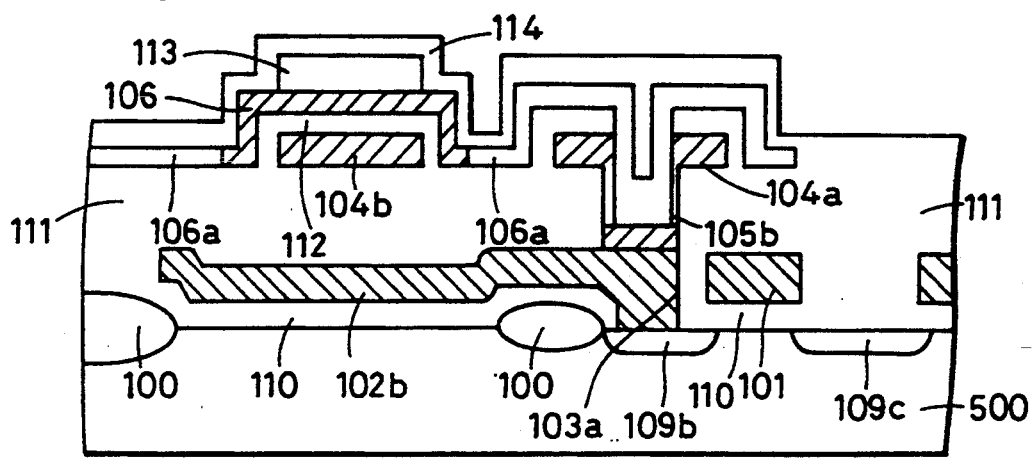

As illustrated in FIG. 14, a lower layer insulating film 113 is formed on third polycrystalline silicon film 106 to have the same shape in plan view as gate electrode 104b. An upper layer insulating film 114 is formed on the whole surface to cover lower layer insulating film 113. p-type impurities are implanted into third polycrystalline silicon film 106 with the implantation energy being controlled by utilizing the thickness of lower layer insulating film 113 and upper layer insulating film 114. p-type source/drain regions 106a of low concentration are formed by heat treatment in a later step.

Figure 15:
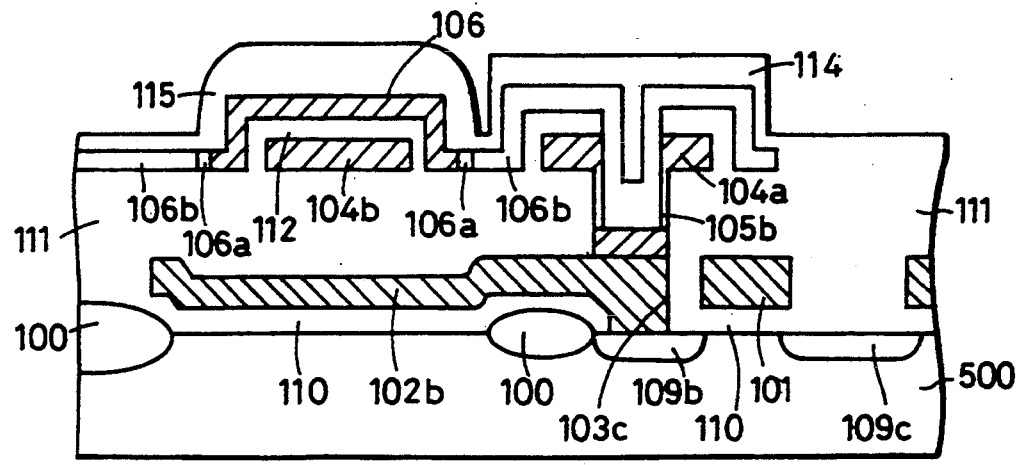
Figure 16A:
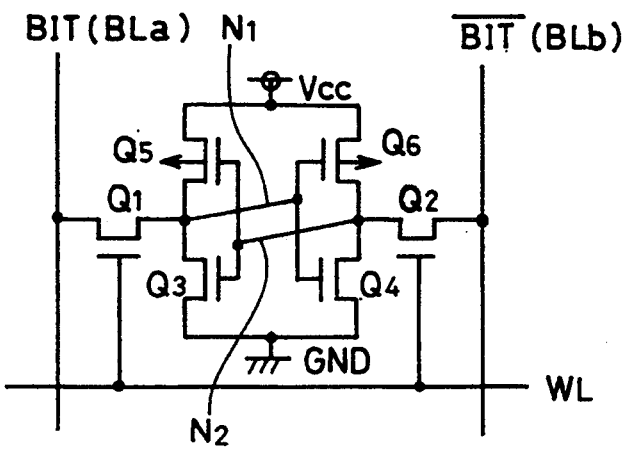
FIG. 16A is an equivalent circuit diagram illustrating a conventional memory cell in a CMOS-type SRAM.
Figure 16B:
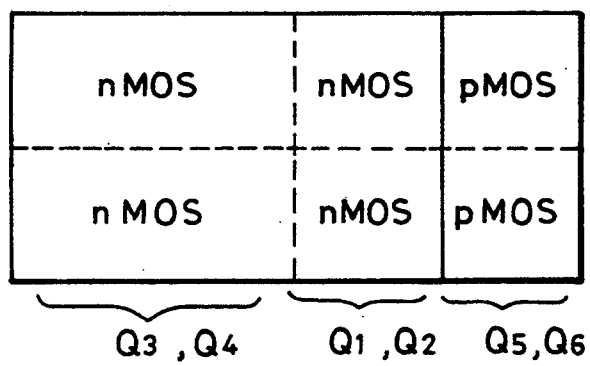
FIG. 16B is a plan view schematically illustrating the same memory cell.
Figure 16C:
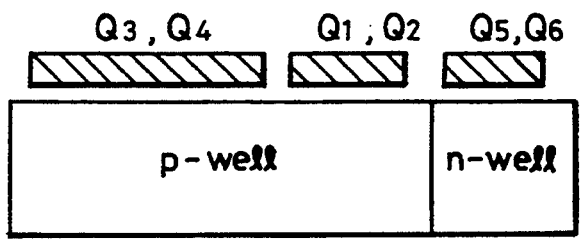
FIG. 16C is a cross sectional view schematically illustrating the same memory cell.
Figure 17A:
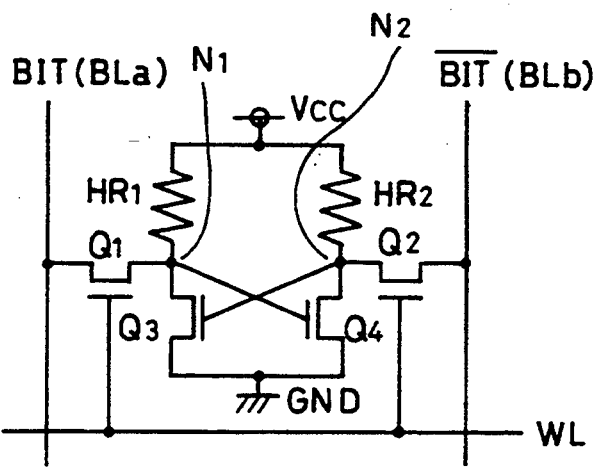
FIG. 17A is an equivalent circuit diagram illustrating a conventional memory cell in a high resistance load type SRAM.
Figure 17B:
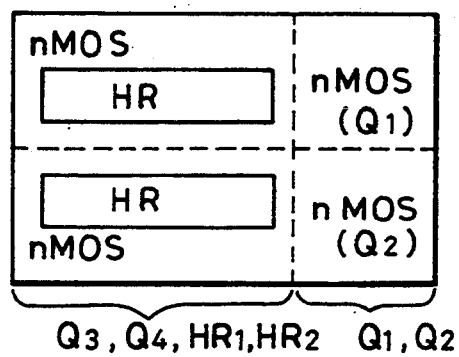
FIG. 17B is a plan view schematically illustrating the same memory cell.
Figure 17C:
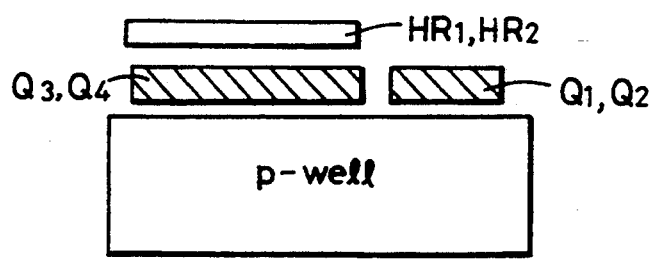
FIG. 17C is a cross sectional view schematically illustrating the same memory cell.
Figure 18A:
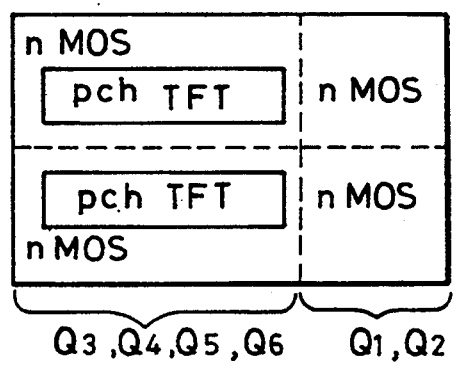
FIG. 18A is a plan view schematically illustrating a conventional memory cell in a CMOS-type SRAM to which a p-channel thin film transistor is applied.
Figure 18B:
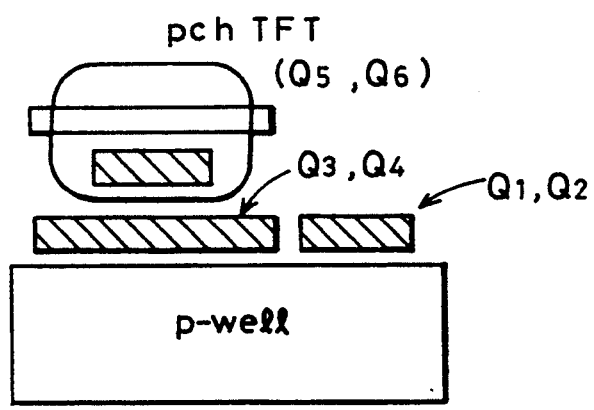
FIG. 18B is a cross sectional view schematically illustrating the same memory cell.
Figure 19:
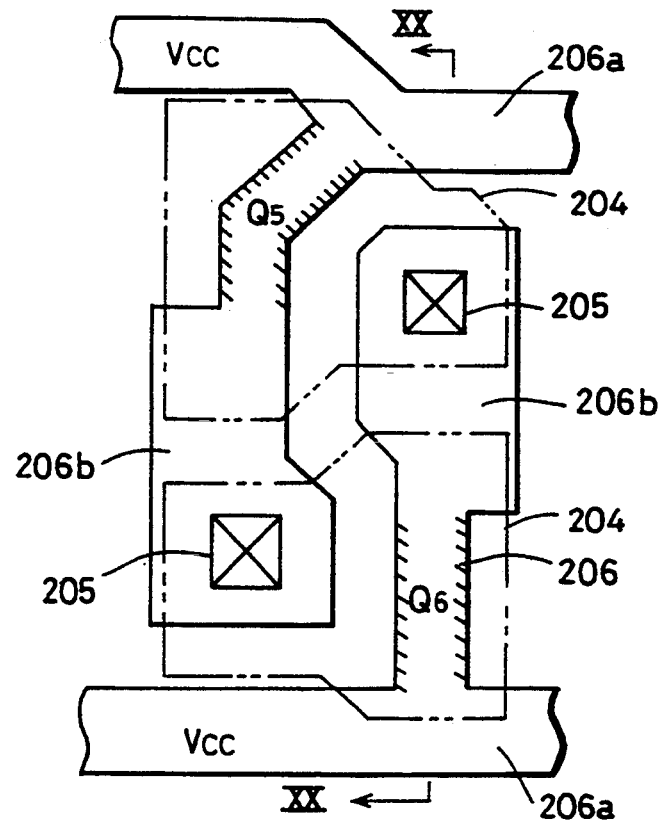
FIG. 19 is a partial plan view illustrating an arrangement in an upper layer part of a conventional memory cell in a CMOS-type SRAM to which a thin film transistor is applied.
Figure 20:
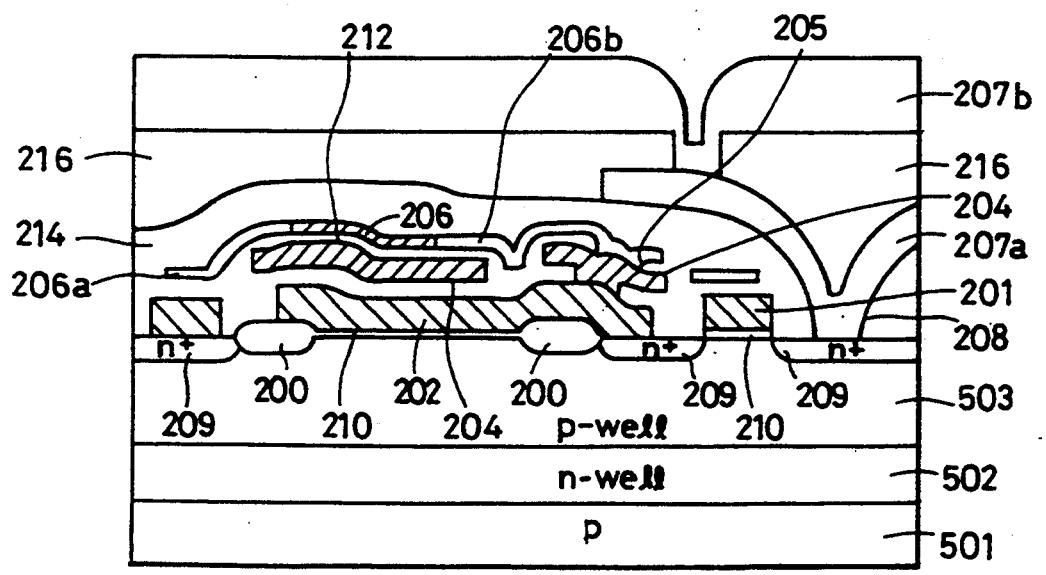
FIG. 20 is a partial cross sectional view illustrating a cross section taken along line XX—XX in FIG. 19.
Figure 21A:
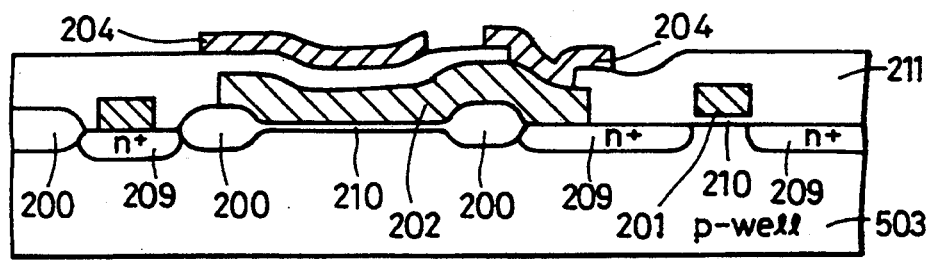
FIGS. 21A–21C are partial cross sectional views sequentially illustrating cross sectional structures of a conventional memory cell in a CMOS-type SRAM to which a thin film transistor is applied in respective steps of a method of manufacturing the same.
Figure 21B:
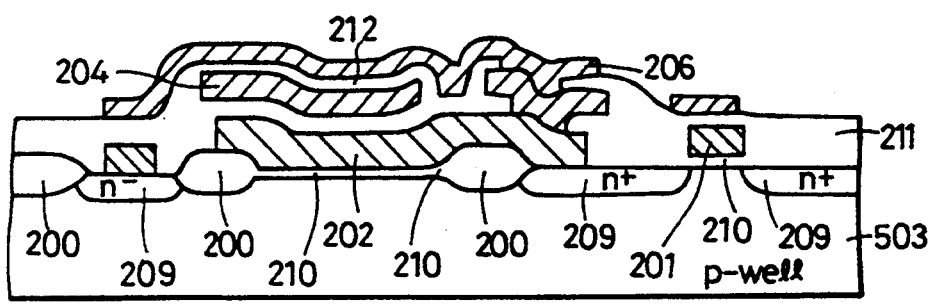
Figure 21C:
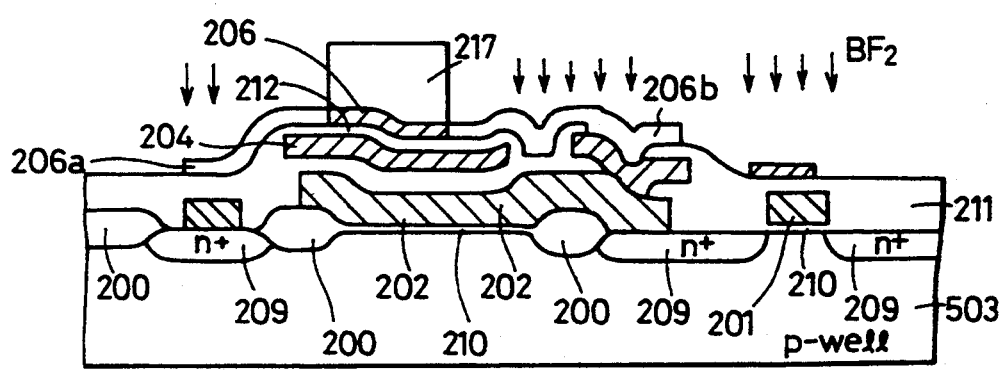

Then, as illustrated in FIG. 15, an insulating film is formed on the whole surface, and then anisotropic etching is carried out to form sidewall insulating films 115 in both sidewall parts of the steps formed by gate electrode 104b. P-type impurities are ion-implanted with the implantation energy being controlled by utilizing the thickness of sidewall insulating films 115 and upper layer insulating film 114 to form p-type source/drain regions 106b of high concentration in third polycrystalline silicon film 106.

Finally, as illustrated in FIG. 7, an interlayer insulating film 116 is formed to cover the p-channel TFT. A contact hole 108b is formed in interlayer insulating film 116 to expose the surface of n+ impurity region 109c. An aluminum interconnection layer 107b is formed to be in contact with n+ impurity region 109c through contact hole 108b. Thus, a memory cell in a CMOS-type SRAM to which a p-channel TFT of the present invention is applied is manufactured.

Although a case where both of the source/drain regions of the p-channel TFT are formed of impurity regions of high concentration and of low concentration has been described in the above embodiment, it is possible to form only one of them, especially the drain region, to include impurity regions of low concentration and of high concentration and to form the source region of impurity region of high concentration.

As described above, according to the field effect transistor in accordance with an aspect of the present invention, impurity regions are formed of regions of low concentration and of high concentration, so that the electric field at the junction of the channel and drain is mitigated, electrons flowing from the drain into the channel region are reduced, and it becomes possible to make the leakage current in the nonoperating state as small as possible. In addition, it becomes possible to increase the drain current in the operating state of the field effect transistor.

According to the static-type semiconductor memory device in accordance with another aspect of the present invention, the above-described field effect transistor is adapted as a load transistor, so that it is possible to reduce the power consumption in the waiting state as well as to stabilize the data holding characteristic.

Furthermore, according to the method of manufacturing a field effect transistor in accordance with still another aspect of the present invention, the impurity regions are formed by carrying out ion implantation utilizing the step part formed by the gate electrode, so that the impurity regions can be formed in a self-align manner with the gate electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor, comprising:
   a gate electrode on an insulator;
   a gate insulating film on the insulator and overlying the gate electrode;
   a thin semiconductor film on the gate insulating film and surrounding said gate electrode, a portion of said thin semiconductor film forming a channel region; and
   source and drain impurity regions having upper surfaces formed entirely in coplanar portions of the thin semiconductor film separated by the channel region and beneath the plane defined by the upper surface of said gate electrode,
   wherein at least one of said impurity regions includes:
   (i) a first impurity region close to said gate electrode having impurities of a first concentration, and
   (ii) a second impurity region adjacent said first impurity region having impurities of a second concentration higher than the first concentration.

2. The field effect transistor according to claim 1, wherein said semiconductor film is on the top surface and the side surfaces of said gate electrode with said gate insulating film interposed therebetween.

3. The field effect transistor according to claim 2, further comprising sidewall insulating films on said semiconductor film along the side surfaces of said gate electrode.

4. The field effect transistor according to claim 3, wherein said first impurity region is in a region of said semiconductor film under said sidewall insulating film.

5. The field effect transistor according to claim 1 wherein said gate electrode includes a polycrystalline silicon layer.

6. The field effect transistor according to claim 1, wherein said semiconductor film includes polycrystalline silicon.

7. The field effect transistor according to claim 1, wherein said first concentration is within the range of $10^{15}/cm^3$ to $10^{16}/cm^3$, and said second concentration is within the range of $10^{18}/cm^3$ to $10^{19}/cm^3$.

8. A semiconductor device, comprising:
a first conductivity-type semiconductor substrate having a main surface;
a second conductivity-type field effect transistor formed on the main surface of said semiconductor substrate; and
a first conductivity-type field effect transistor electrically connected to said second conductivity-type field effect transistor,
wherein said first conductivity-type field effect transistor includes:
a gate electrode above said second conductivity-type field effect transistor,
a gate insulating film on said gate electrode,
a thin semiconductor film on said gate insulating film and surrounding said gate electrode, a portion of said thin semiconductor film forming a channel region, and
first conductivity-type source and drain impurity regions having upper surfaces formed entirely in coplanar portions of said thin semiconductor film separated by the channel region and beneath the plane defined by the upper surface of said gate electrode,
wherein at least one of said impurity regions includes:
(i) a first impurity region close to said gate electrode having impurities of the first conductivity type of a first concentration and
(ii) a second impurity region adjacent said first impurity region having impurities of the first conductivity type of a second concentration higher than said first concentration.

9. The semiconductor device according to claim 8, wherein said second conductivity-type field effect transistor includes:
a pair of second conductivity-type impurity regions on the main surface of said semiconductor substrate, spaced apart from each other to define a channel region; and
a gate electrode on said channel region with an insulating film interposed therebetween.

10. The semiconductor device according to claim 9, wherein one of said impurity regions in said second conductivity-type field effect transistor is electrically connected to one of said impurity regions in said first conductivity-type field effect transistor.

11. The semiconductor device according to claim 9, wherein one of said impurity regions of said first conductivity-type field effect transistor is electrically connected to said gate electrode of said second conductivity-type field effect transistor.

12. The semiconductor device according to claim 9, wherein said gate electrode of said first conductivity-type field effect transistor is electrically connected to said impurity region of said second conductivity-type field effect transistor.

13. The semiconductor device according to claim 8, wherein an insulating layer is formed between said first conductivity-type field effect transistor and said second conductivity-type field effect transistor.

14. The semiconductor device according to claim 13, wherein said first conductivity-type field effect transistor and said second conductivity-type field effect transistor are electrically connected through a through-hole in said insulating layer formed therebetween.

15. A static-type semiconductor memory device provided with a memory cell having a complementary field effect transistor, comprising:
a first conductivity-type semiconductor substrate having a main surface; and
a plurality of memory cells formed on the main surface of said semiconductor substrate,
wherein each of said memory cells includes:
first and second driver transistors formed, respectively, of second conductivity-type field effect transistors on the main surface of said semiconductor substrate and having the gate electrodes and the drain electrodes cross-coupled, and
first and second load transistors formed, respectively, of first conductivity-type field effect transistors connected, respectively, to the drain electrodes of said first and second driver transistors,
wherein each of said first and second load transistors includes:
a gate electrode above said first and second driver transistors,
a gate insulating film on said gate electrode;
a thin semiconductor film on said gate insulating film, and surrounding said gate electrode, a portion of said thin semiconductor film forming a channel region, and
first conductivity-type source and drain impurity regions having upper surfaces formed entirely in coplanar portions of said thin semiconductor film separated by said channel region and beneath the plane defined by the upper surface of said gate electrode, one of said impurity regions being connected to the drain electrode of each of said first and second driver transistors,
wherein at least one of said impurity regions includes:
(i) a first impurity region close to said gate electrode having impurities of a first conductivity type of a first concentration; and
(ii) a second impurity region adjacent said first impurity region having impurities of the first conductivity type of a second concentration higher than said first concentration.

16. The static-type semiconductor memory device according to claim 15, wherein
said first driver transistor includes a source region and a drain region of the second conductivity type formed on the main surface of said semiconductor substrate, spaced apart from each other to define a channel region, and a gate electrode formed on said channel region with a gate insulating film interposed therebetween, said source region being connected to a first potential node, said drain region being connected to a first memory cell node, and said gate electrode being connected to a second memory cell node, and
said second driver transistor includes a source region and a drain region formed on the main surface of said semiconductor substrate, spaced apart from each other to define a channel region, and a gate electrode formed on said channel region with a gate insulating film interposed therebetween, said source region being connected to said first potential node, said drain region being connected to said second memory cell node, and said gate electrode being connected to said first memory cell node, and an insulating layer is formed to cover said first and second driver transistors, and said first load transistor includes a source region and a drain region of said two impurity regions, said source region being connected to a second potential node, said drain region being connected to said first memory cell node, and said gate electrode of said first load transistor being connected to said second memory cell node, and said second load transistor includes a source region and a drain region of said two impurity regions, said source region being connected to said second potential node, said drain region being connected to said second memory cell node, and said gate electrode of said second load transistor being connected to said first memory cell node.

17. The static-type semiconductor memory device according to claim 16, wherein each of said memory cells is provided at a crossing of a word line and a bit line pair on the main surface of said semiconductor substrate, and each of said memory cells includes:

a first access transistor formed of a field effect transistor of the second conductivity type including a pair of impurity regions of the second conductivity type formed in the main surface of said semiconductor substrate, spaced apart from each other to define a channel region, and a gate electrode formed on said channel region with a gate insulating film interposed therebetween, said gate electrode being connected to said word line, one of said impurity regions being connected to one bit line of said bit line pair, the other one of said impurity regions being connected to said first memory cell node; and a second access transistor formed of a field effect transistor of the second conductivity type including a pair of impurity regions of the second conductivity type formed on the main surface of said semiconductor substrate, spaced from each other to define a channel region, and a gate electrode formed on said channel region with a gate insulating film interposed therebetween, said gate electrode being connected to said word line, one of said impurity regions being connected to the other bit line of said bit line pair, the other one of said impurity regions being connected to said second memory cell node.

* * * * *